United States Patent [19]

Takeda et al.

[11] Patent Number: 5,450,039
[45] Date of Patent: Sep. 12, 1995

[54] INTEGRATED CIRCUIT HAVING SELF-CONTAINED VOLTAGE CONTROL OSCILLATION CIRCUIT

[75] Inventors: Isoshi Takeda; Shigeyoshi Hayashi, both of Kyoto, Japan

[73] Assignee: Rohm Co., Ltd., Kyoto, Japan

[21] Appl. No.: 125,557

[22] Filed: Sep. 23, 1993

[51] Int. Cl.$^6$ .............................................. H03B 5/00
[52] U.S. Cl. ........................................ 331/48; 331/56; 331/108 B; 331/108 C; 331/177 R
[58] Field of Search ............ 331/48, 56, 108 B, 108 C, 331/135–137, 176, 177 R; 315/307; 333/174

[56] References Cited

U.S. PATENT DOCUMENTS 4,018,126  4/1977  Walmann .............................. 333/174

*Primary Examiner*—Robert J. Pascal
*Assistant Examiner*—David H. Vu
*Attorney, Agent, or Firm*—Brumbaugh, Graves Donohue & Raymond

[57] ABSTRACT

An integrated circuit has a self-contained voltage control oscillation circuit wherein the oscillating frequency is controlled according to a control voltage; The circuit includes a first oscillation circuit which forms a first oscillation loop including a first amplifier for generating a first output signal with an oscillating frequency which is controlled according to an operating current of the first amplifier and a second oscillation circuit which forms a second oscillation loop including a second amplifier for generating a second output signal with an oscillating frequency which is controlled according to an operating current of the second amplifer; A circuit for generating a control voltage controls the operating currents of the first and second amplifers and a current regulating circuit for generating an operating current regulating signal regulates the operating currents of the first and second amplifers. The control volage generating circuit may include a first generator for generating a first control voltage which controls the operating current of the first amplifier and a second generator for generating a second control voltage which controls the operating current of the second amplifier.

8 Claims, 4 Drawing Sheets

INTEGRATED CIRCUIT HAVING SELF-CONTAINED VOLTAGE CONTROL OSCILLATION CIRCUIT

BACKGROUND OF THE INVENTION

1. Field of the Invention

The present invention relates generally to integrated circuits having a self-contained voltage control oscillation circuit, and more particularly to such an integrated circuit having a self-contained voltage control oscillation circuit which outputs a plurality of oscillating signals for use in a signal processing circuit for audio, imaging equipment and the like.

2. Discussion of the Related Art

FIG. 4 shows an example of a conventional voltage control oscillation circuit. In FIG. 4, numeral reference 31 denotes a charge-discharge switching circuit, 32 a capacitor, 33 a discharge resistor and 34 a control voltage input terminal.

The charge-discharge switching circuit 31 is arranged to charge and discharge the capacitor 32 alternately, and the charging voltage has two threshold values: an upper and a lower threshold value. When a charging voltage reaches the upper threshold value in the capacitor 32, the charging of the capacitor 32 is stopped. Then the capacitor 32 is discharged by the discharge resistor 33 connected thereto in parallel and the charging voltage drops. When the charging voltage drops to the lower threshold value, the charge-discharge switching circuit 31 charges the capacitor 32.

Since the capacitor 32 is charged with current surpassing the discharging current due to the discharge resistor 33, the charging voltage rises and reaches the upper threshold value in the capacitor 32. The process mentioned above is repeated in that way and a saw tooth or triangular oscillating signal is output.

Further, either the upper or the lower threshold value varies according to the control voltage received via the control voltage input terminal 34, thus causing the amplitude of the oscillating signal to vary. On the other hand, charge-discharge constants for defining the inclination of the oscillating signal are fixed. Therefore, the oscillating frequency varies with the repetitive period. The oscillating frequency of the output signal is thus controlled by the control voltage.

However, an oscillating circuit of the sort set forth above needs an externally-installed capacitor with a relatively large capacity, and this tends to render such an oscillating circuit liable to frequency fluctuation due to aging change of the capacitor, thus necessitating arranging a regulating circuit (not shown).

FIG. 5 illustrates an exemplary voltage control oscillation circuit using a ceramic or quartz oscillator 41 in order to improve aging and temperature change characteristics. In this case, the oscillating frequency of the output signal is still controllable as the charge-discharge time constants of the capacitors 42 and 43 vary with the control voltage via a terminal 44.

FIG. 6 illustrates an exemplary oscillation circuit using an operational amplifier, wherein oscillation is made by charging and discharging a capacitor 52 via a resistor 51, and a capacitor 54 via a resistor 53. The resistance of this circuit is replaced by that of a circuit equivalent to a variable resistor, though the illustration thereof has been omitted. Moreover, the oscillating frequency is controlled as the apparent value of resistivity of the equivalent circuit varies with the control voltage.

In the case of the conventional integrated circuit having a self-contained voltage control oscillation circuit, the voltage control oscillation circuit has been incorporated in an integrated circuit. Since equipment of this sort is normally required to issue a plurality of oscillating signals, a plurality of oscillation circuits are integrated onto one chip, whereby the plurality of oscillating signals are supplied from one integrated circuit.

The circuits shown in FIGS. 4 and 6 need large capacity capacitors in order to obtain a precise oscillating frequency and a regulating circuit to offset fluctuations originating from variations in the capacity of capacitors.

The reason stated above thus makes impossible any attempt to form into an integrated circuit (IC) with the whole of such a conventional circuit having a plurality of self-contained voltage control oscillation circuits.

Although the oscillating frequency is easily stabilized with the circuit shown in FIG. 5, an output signal frequency directly available becomes considerably high as the oscillating frequency is determined by the natural oscillation inherent in a ceramic oscillator or the like.

Consequently, the frequency will have to be divided a number of times until a desired one is obtained and an area to be occupied by a frequency divider tends to increase sharply in the chip containing the integrated circuit. An increase in the chip area will result in decreasing not only a yield of chips but also a yield rate per wafer, and this is disadvantageous as it pushes up the IC production cost.

Moreover, the oscillator is relatively expensive and will have to be externally-installed. When it is attempted to obtain an output signal having an oscillating frequency unobtainable by dividing the frequency, each oscillation circuit also needs an externally-installed regulating circuit.

Thus externally-installed parts and regulating circuits in addition to such an integrated circuit having a self-contained voltage control oscillation circuit are required, and this is also disadvantageous as the packaging density lowers. Particularly, in the case of an integrated circuit having a plurality of self-contained voltage control oscillation circuits, each oscillation circuit needs regulating and the oscillating frequency characteristics of the output signals can hardly be uniformized. The problem is that a great deal of manhours required for regulating decreases production efficiency.

SUMMARY OF THE INVENTION

The present invention has been made to solve the foregoing problems in the prior art, and it is an object of the invention to provide a circuit in which circuit components are integrated into a complete circuit as an integrated circuit having a self-contained voltage control oscillation circuit capable of easily regulating oscillating frequencies of a plurality of output signals.

In order to accomplish the above object of the present invention, there is provided an integrated circuit having a self-contained voltage control oscillation circuit wherein oscillating frequency is controlled according to a control voltage, which comprises an operating current regulating circuit for regulating an amplifier operating current, a first oscillation circuit having a first amplifier and a second oscillation circuit having a second amplifier.

The operating current regulating circuit includes a resistor circuit having a plurality of resistors and generates an operating current regulating signal in accordance with a value of the circuit resistance of the resistor circuit.

The first oscillation circuit causes a first oscillation loop maintaining the oscillating state to generate a first output signal. The oscillating state of the first oscillation loop is varied according to the operating current of the first amplifier in the first oscillation loop so as to control the oscillating frequency of the first output signal. Further, the operating current of the first amplifier is controlled by the control voltage (or a current signal resulting from voltage-current conversion).

The second oscillation circuit causes a second oscillation loop maintaining the oscillating state to generate a second output signal. The oscillating state of the second oscillation loop is varied according to the operating current of the second amplifier in the second oscillation loop so as to control the oscillating frequency of the second output signal. Further, the operating current of the second amplifier is controlled by the control voltage or another control voltage (or a current signal resulting from voltage-current conversion).

The operating currents of both the first and second amplifiers are regulated by the operating current regulating signal.

In this case, variable amplifiers are used as specific examples of the first and second amplifiers.

The integrated circuit thus arranged according to the present invention has a plurality of self-contained oscillation circuits for generating a plurality of output signals. The output signals are generated from the respective oscillation circuits in which the oscillating state of each oscillation loop is controlled in accordance with any one of the different control voltage or in accordance with the same one. In this case, the oscillation circuits are substantially similar in arrangement to each other and packaged on one and the same chip. As the oscillation circuits are produced through exactly the same manufacturing process, the characteristics of the amplifiers in the respective circuits of the integrated circuit are uniform.

The oscillating frequency of the oscillation circuit is controlled via the operating current of the amplifier. Consequently, capacitors and resistors to be connected to the oscillation loop are freely selectable as the range of controlling the oscillating frequency can be set wider. By making use of this advantage, the capacity of the capacitor can therefore have a sufficiently small value with the effect of stabilizing the oscillating state. As a result, circuit components including capacitors may be integrated into a single package.

As each of the capacitors and resistors, for example, in the integrated circuit is produced through the same manufacturing process, their characteristics are uniform. Since these circuit components and the amplifiers are produced together, the oscillating frequency of each oscillation circuit is uniformly increased or decreased by uniformly increasing or decreasing the operating currents of the amplifiers.

The operating current regulating circuit has the resistor circuit including the plurality of resistors. Then, the value of the circuit resistance can be set by varying the connecting condition of some resistors among those constituting the resistor circuit before the circuit components are integrated into a single package. In other words, the operating current regulating signal is determined by the value of the circuit resistance of the resistor circuit and by increasing or decreasing the operating current regulating signal, the operating current of each amplifier is uniformly increased or decreased, whereby the oscillating frequency of the output signal from each oscillation circuit is also uniformly increased or decreased. Therefore, the plurality of output signals from the integrated circuit are completely regulated only by setting the value of one operating current regulating signal.

The value of the operating current regulating signal is regulated beforehand so that IC-to-IC variations may be suppressed without any other regulating circuits.

In consequence, the circuit components can be formed into a complete integrated circuit having a self-contained voltage control oscillation circuit without the provision of any externally-installed circuit for the oscillation loop. Since the whole oscillation circuit is completely regulated by adjusting the connections in the resistor circuit once at only one place, it is extremely simple to regulate the oscillating frequencies of the respective output signals.

DETAILED DESCRIPTION OF THE PREFERRED EMBODIMENTS

Referring to a block diagram of FIG. 1 and a circuit diagram of FIG. 2, a description will be given of an integrated circuit having a self-contained voltage control oscillation circuit according to an embodiment of the present invention.

Figure 1:
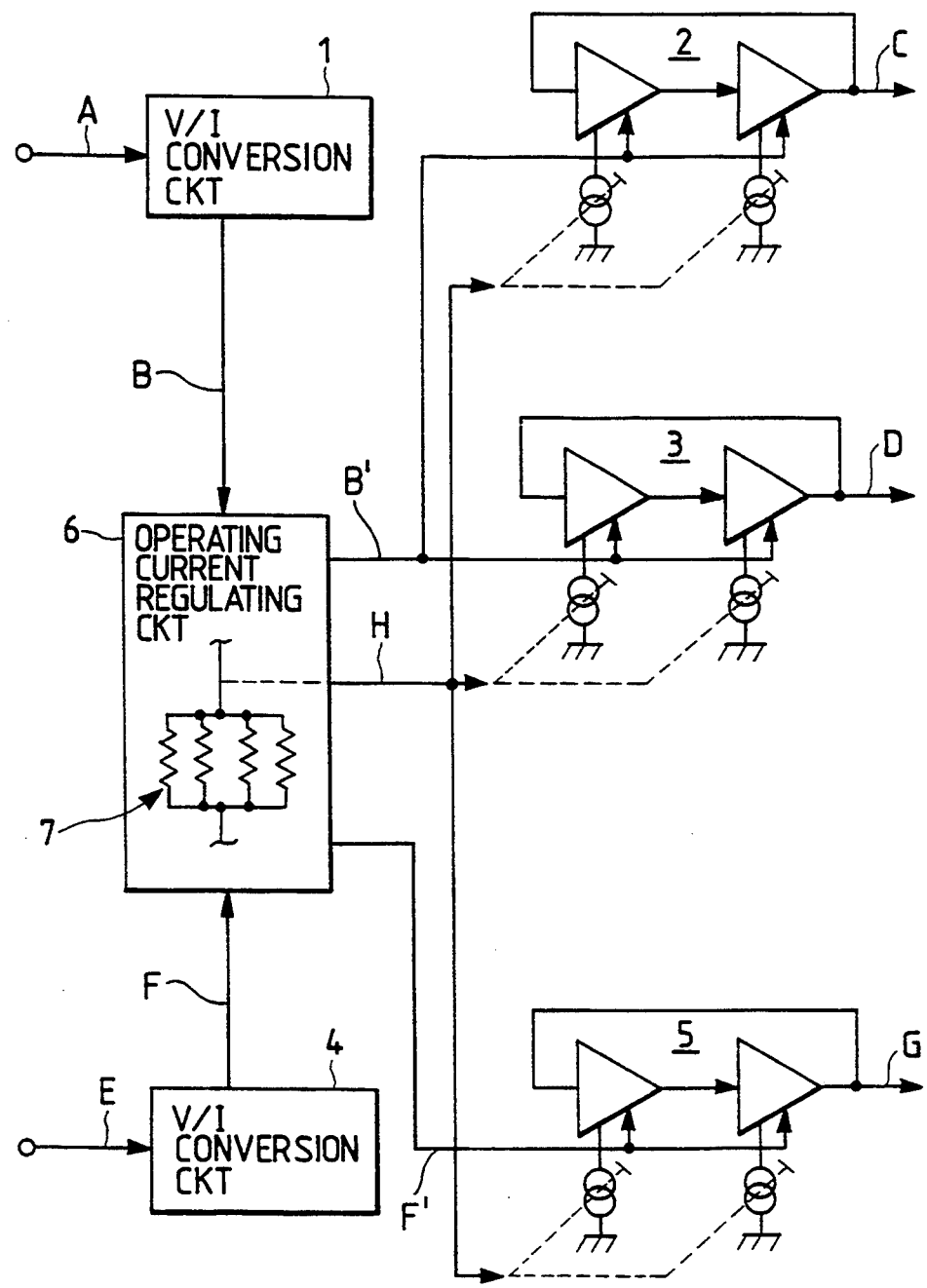
FIG. 1 is a block diagram showing an integrated circuit having a-self-contained voltage control oscillation circuit according to an embodiment of the present invention.

In FIG. 1, numeral reference 1 denotes a voltage-current conversion circuit (V/I conversion circuit), 2 and 3 oscillation circuits, 4 a voltage-current conversion circuit (V/I conversion circuit), 5 an oscillation circuit, 6 an operating current regulating circuit and 7 a resistor circuit.

Figure 2:
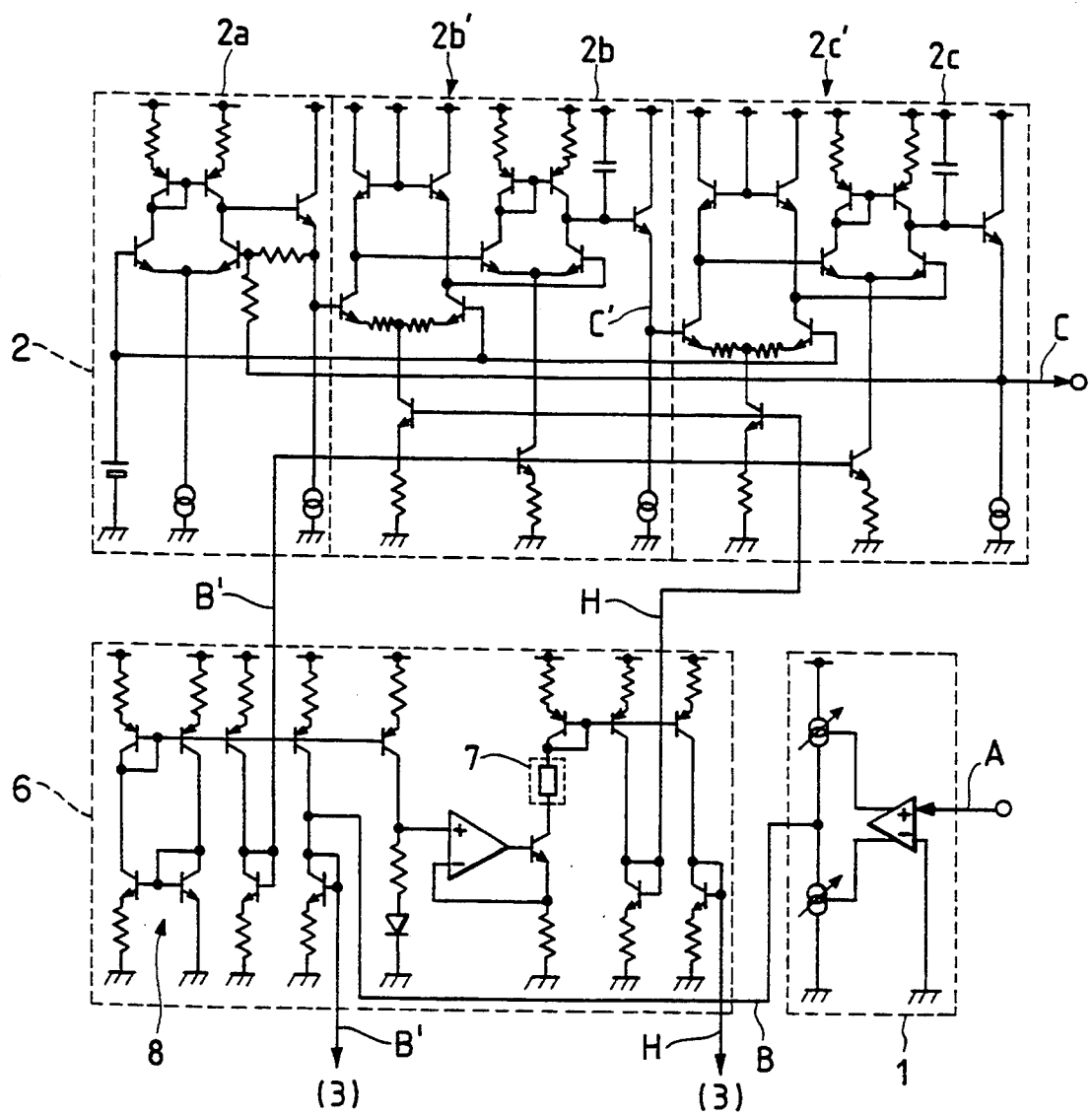
FIG. 2 is a detailed circuit diagram showing the integrated circuit having a self-contained voltage control oscillation circuit according to the present invention.

FIG. 2 is a detailed circuit diagram illustrating circuits corresponding to part of the block of FIG. 1, including the V/I conversion circuit 1, the oscillation circuit 2, the operating current regulating circuit 6, the resistor circuit 7 and a typical conventional temperature compensating circuit 8. As described, for example, in *Principles of Transistor Circuits* by R. F. Shea (Wiley, 1953), at pages 168–179, a temperature compensating circuit eliminates the effect of temperature variations on the operation of circuit components by arranging temperature-sensitive components in a compensating relation. With respect to the other circuits, they correspond in arrangement to those shown in FIG. 2 and the detailed illustration of them will be omitted.

In the oscillation circuits 2 and 3 which are interlocked with each other, the oscillating frequencies of their output signals C and D are controlled by a control current B resulting from the conversion of a control voltage A in the V/I conversion circuit 1 to an output B and temperature compensation of the output B in the regulating circuit 6 to produce the signal B'.

In the oscillation circuit 5, on the other hand, the oscillating frequency of its output signal G is controlled by a control current F resulting from the conversion of another control voltage E in the V/I conversion circuit 4 to an output F and temperature compensation of the output F in the regulating circuit 6 to produce the signal F'.

Referring to the upper half of FIG. 2, the oscillation circuit 2 will be described in detail. The other oscillation circuits 3 and 5 are substantially similar in arrangement to the oscillation circuit 2.

A reverse amplifier 2a, charge-discharge circuits 2b and 2c are sequentially connected together in this order to form an oscillation loop. The signal C resulting from a charge-discharge voltage in the charge-discharge circuit 2 is output as an output signal. At this time, the charge-discharge voltage is output not directly but via a transistor once during producing of the output signal C so that the output signal C may remain unaffected by the output side.

The charge-discharge circuit 2b receives a reverse voltage signal as an input voltage and a variable amplifier 2b' converts the input voltage into a charge-discharge current. Further, the charge-discharge current is used to charge and discharge a capacitor, whereby a charge-discharge voltage signal C' is produced. As the capacitor is charged and discharged, the charge-discharge voltage signal C' lags the reverse voltage signal by a phase difference of 90°.

The charge-discharge circuit 2c is the same in arrangement as the charge-discharge circuit 2b and on receiving the charge-discharge voltage signal C', produces the charge-discharge voltage signal C which further lags by an additional phase difference of 90°.

The charge-discharge voltage signal C is reversed by the reverse amplifier 2a, and this results in producing the reverse voltage signal which still lags by a phase difference of 180°. The reverse voltage signal obtained through a series of steps above undergoes a 360° phase shift and is said to be what is regained after the series of steps taken. Therefore, the oscillation loop is allowed to oscillate continuously.

The oscillating frequency in this case is affected by the charge-discharge current and the capacity of the capacitor. Moreover, the transistor circuit (i.e., the so-called variable amplifier in the embodiment shown) is used to generate the charge-discharge current and the operating current of the amplifier is controlled by a control current B' (following temperature-compensation by the circuit 8 shown in FIG. 2 which is applied to the charge-discharge circuits 2b and 2c so as to control the level of the charge-discharge current.

In other words, the charge-discharge current is generated as, for example, a differential signal, which is controlled by the operating current which has a higher current value level and is readily controllable. Even when the charge-discharge current is a small, its current value level remains stable.

Consequently, the charge-discharge time constant can be kept at a greater values even though the capacity of the capacitor connected to the oscillation loop is small. On condition that the capacity of the capacitor is small, the capacitor may be incorporated in an integrated circuit without greatly increasing a chip area. Moreover, noise is minimized as the oscillating signal has a signal waveform having a harmonic function without including a higher harmonic.

As a result, the oscillation loop thus arranged is capable of oscillation with stability at a lower frequency and also allows even a charge-discharge capacitor to be incorporated in an integrated circuit.

The operating current regulating circuit 6 has the resistor circuit 7. The resistor circuit 7 according to the this embodiment is formed with four resistors connected in parallel and values of their resistivity are set at one-two-four-eight ratio. By cutting the connections of these resistors with a laser trimming device, 16 kinds of values of resistivity may be set out of combinations of the remaining resistors. Then, the value of an operating current regulating signal H, which is applied to current control transistors in the oscillation circuit 2, is determined by the value of effective resistance of the resistor circuit 7. The operating currents of the amplifiers of the oscillation circuits 2 and 3 are controlled by the control current B and simultaneously regulated by the operating current regulating signal H, as shown by separate output lines in FIG. 2. Moreover, the operating current of the amplifier of the oscillation circuit 5 is controlled by the control current F, and also simultaneously regulated by the operating current regulating signal H. In other words, the oscillating state of the oscillation circuits 2, 3 and 5 is equally regulated by the operating current regulating signal H.

As noted previously, on the other hand, the oscillation circuits 2, 3 and 5 are produced through the same process of manufacturing semiconductors. The characteristics of amplifiers, capacitors, resistors and the like as circuit components are thus uniformized. The oscillating characteristics of these oscillation circuits in the integrated circuit are made uniform, so that the oscillating frequencies of these oscillation circuits uniformly fluctuate to substantially same extent of increase and decrease as long as they exist in at least the same integrated circuit, though their characteristics fluctuate on a manufacturing lot or IC basis. In other words, the regulating process performed for one oscillation circuit in the same integrated circuit is directly applicable to the other oscillation circuits. One operating current regulating signal H may effectively be used to regulate the plurality of oscillation circuits 2, 3 and 5 as stated above.

The control voltage A is therefore given as a reference voltage at the stage of probe-testing the integrated circuit so as to examine the oscillating frequency of the output signal C or D. The control voltage E is otherwise given as a reference voltage so as to examine the oscillating frequency of the output signal G. Then the degree of transition of the oscillating frequency from a reference oscillating frequency is detected and a value of resistivity of the resistor circuit 7 which may best offset the transition is selected and set by the laser trimming device as stated above; that is, this is only the regulating process to be performed, irrespective of the number of oscillation circuits. As the regulating process can also readily be performed, the production efficiency is improved.

Only one place is checked beforehand during the process of manufacturing the integrated circuit. Since the plurality of output signals in the same integrated circuit mutually undergo least variation and fluctuation, the oscillating frequency of the output signal of the integrated circuit having a self-contained voltage control oscillation circuit is stabilized. Moreover, the output signals of integrated circuits are set free from variation after the regulating process is completed. As any other regulating process is unnecessary, the output signals C, D and G at the predetermined oscillating frequencies are output.

Therefore, no externally-installed regulating circuits are needed for the circuit using this integrated circuit and this makes it unnecessary to regulate each of the oscillation circuits after they are incorporated in the intended equipment.

The integrated circuit having a self-contained voltage control oscillation circuit thus arranged according to the present invention is such that a complete circuit can be manufactured as a single package, and therefore fit for high-density packaging. Moreover, the oscillating frequencies of the plurality of output signals become readily regulated to ensure high productivity.

The resistor circuit according to the present embodiment has been shown only by way of example. The number of resistors may be increased in proportion to the precision required and may otherwise be equipped with resistors having the same value of resistivity, and a serial connection may also be employed simultaneously.

Moreover, the temperature compensating circuit 8 has been provided as part of the operating current regulating circuit 6 according to the embodiment, whereby not only the control current B but also the operating current regulating signal H is compensated for in terms of temperatures. Therefore, the operating characteristics at varying temperatures are improved further.

Figure 3:
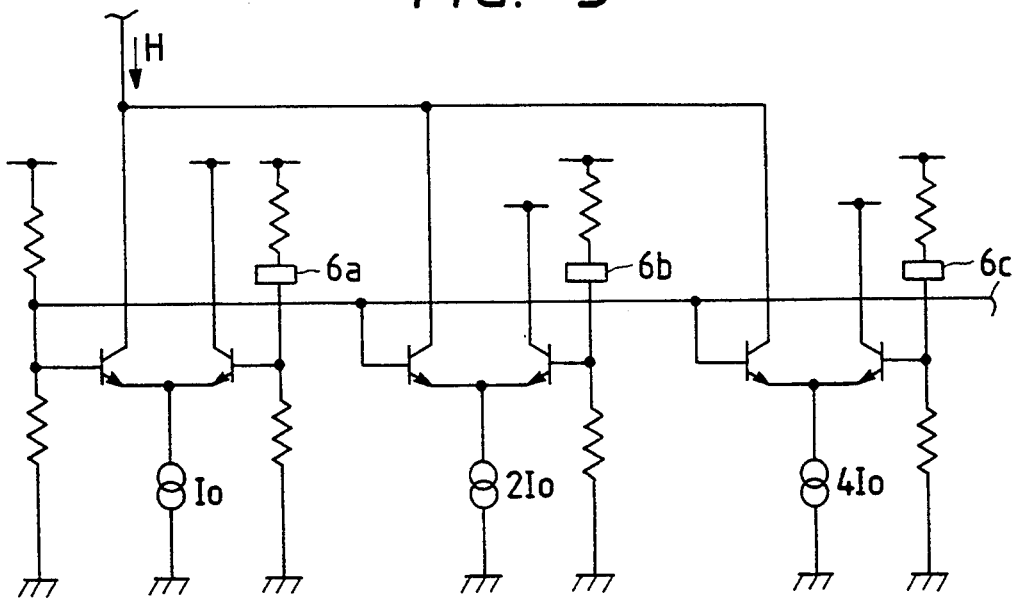
FIG. 3 is a detailed circuit diagram showing a current regulating circuit in the integrated circuit having a self-contained voltage control oscillation circuit according to the present invention.
Figure 4:
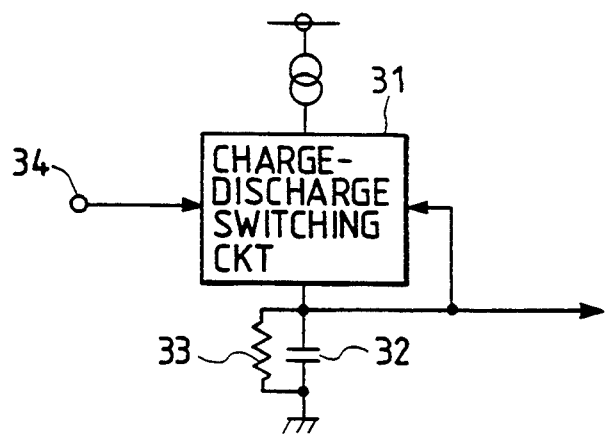
FIG. 4 is a conventional voltage control oscillation circuit diagram.
Figure 5:
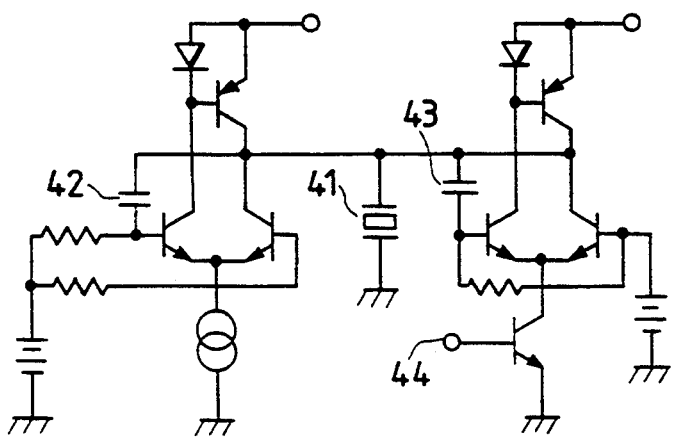
FIG. 5 is a conventional voltage control oscillation circuit diagram.
Figure 6:
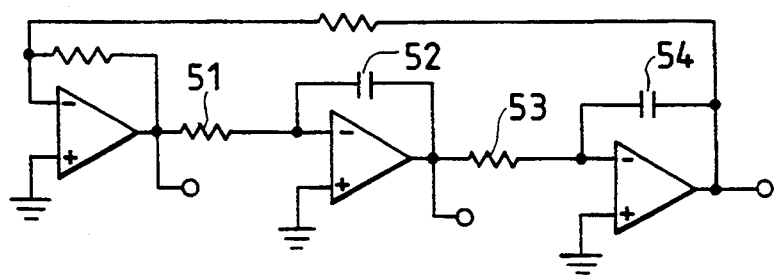
FIG. 6 is a conventional oscillation circuit diagram.

FIG. 3 shows another specific current regulating circuit. In this case, a plurality of constant current circuits are lined up and the total sum of currents H is set as the regulating current. A resistor circuit with two resistors connected in series corresponds to each constant current circuit, and a constant current having a current value IO, 2×IO, 4×IO . . . flows therethrough in the initial state, depending on the divided voltage. Further, the constant current in the constant current circuit corresponding to the cut resistor circuit is stopped when spots 6a, 6b, 6c . . . intended for cutting off are cut. The current value of the operating current regulating signal H can be set in the same manner as stated above with effects similar to those exemplified above.

As will be understood from the description given so far, the plurality of oscillation circuits respectively using the variable amplifiers or the like are incorporated in one and the same integrated circuit having a self-contained voltage control oscillation circuit. The operating current regulating circuit having the resistor circuit is also provided so that the operating currents of the amplifiers are collectively regulated by setting the value of resistivity at one place. Any other regulating process can thus be dispensed with. As a result, the whole circuit component is formed into an integrated circuit, and this contributes to the high-density packaging of equipment. Further, the oscillating frequencies of the plurality of output signals are readily regulated with the effect of not only improving productivity of integrated circuits and equipment but also reducing production cost.

What is claimed is:

1. An integrated circuit having a self-contained voltage control oscillation circuit wherein oscillating frequency is controlled according to a control voltage, said integrated circuit comprising:
   first oscillation means which forms a first oscillation loop including a first amplifier for generating a first output signal with an oscillating frequency which is controlled according to an operating current of said first amplifier;
   second oscillation means which forms a second oscillation loop including a second amplifer for generating a second output signal with an oscillating frequency which is controlled according to an operating current of said second amplifer;
   means for generating a control voltage which controls the operating currents of said first and second amplifers; and
   current regulating means for generating an operating current regulating signal which regulates the operating currents of said first and second amplifers.

2. An integrated circuit as claimed in claim 1, wherein said control volage generating means comprises a first generator for generating a first control voltage which controls the operating current of said first amplifier and a second generator for generating a second control voltage which controls the operating current of said second amplifier.

3. An integrated circuit as claimed in claim 2, wherein said first oscillation means comprises a plurality of oscillation circuits connected in parallel.

4. An integrated circuit as claimed in claim 1, wherein said current regulating means comprises a resistor circuit having a plurality of resistors to generates said operating current regulating signal according to a value of resistivity of said resistor circuit.

5. An integrated circuit as claimed in claim 4, wherein each of said plurality of resistors of said resistor circuit has a resistance value different from the others of the plurality.

6. An integrated circuit as claimed in claim 1, wherein said current regulating means comprises a plurality of constant current circuits having a plurality of resistors for generating constant currents having a value corresponding to respective voltages resulting from voltage division made by said resistors, and means for generating the sum of the constant currents in said constant current circuits as the operating current regulating signal.

7. An integrated circuit as claimed in claim 1, wherein said control voltage generating means comprises a voltage-current conversion circuit for converting said control voltage into a control current.

8. An integrated circuit as claimed in claim 1, wherein said current regulating means includes a temperature compensating circuit.

* * * * *